United States Patent
Cai et al.

(10) Patent No.: US 8,912,030 B2
(45) Date of Patent: Dec. 16, 2014

(54) METHOD FOR RADIATION MONITORING

(71) Applicant: International Business Machines Corporation, Armonk, NY (US)

(72) Inventors: Jin Cai, Cortlandt Manor, NY (US); Effendi Leobandung, Wappingers Falls, NY (US); Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 13/647,547

(22) Filed: Oct. 9, 2012

(65) Prior Publication Data
US 2014/0088401 A1    Mar. 27, 2014

Related U.S. Application Data

(63) Continuation of application No. 13/625,440, filed on Sep. 24, 2012.

(51) Int. Cl.
*H01L 21/00* (2006.01)
*H01L 27/14* (2006.01)
(Continued)

(52) U.S. Cl.
CPC ........... *H01L 27/14* (2013.01); *H01L 27/14689* (2013.01); *H01L 31/0312* (2013.01); *H01L 21/02* (2013.01); *H01L 31/0304* (2013.01); *H01L 31/028* (2013.01)
USPC .................. 438/48; 438/57; 438/73; 257/76; 257/77

(58) Field of Classification Search
CPC ... H01L 27/14; H01L 21/02; H01L 27/14689; H01L 27/14643; H01L 27/14609; H01L 31/1804; H01L 31/0312; H01L 31/0304; H01L 31/028

USPC ....................... 438/49, 57, 73, 48; 257/76, 77
See application file for complete search history.

(56) References Cited

U.S. PATENT DOCUMENTS 6,977,989 B2 * 12/2005 Bothe et al. ................... 378/108
6,995,376 B2    2/2006 Cottrell et al.
(Continued)

FOREIGN PATENT DOCUMENTS

EP     2259763 A1    12/2010
JP     1240885        9/1989
(Continued)

OTHER PUBLICATIONS

McLain et al., "Analytical Model of Radiation Response in FDSOI MOSFETS", IEEE 46th Annual International Reliability Physics Symposium, Phoenix, 2008, pp. 643-644.
(Continued)

*Primary Examiner* — Thinh T Nguyen
(74) *Attorney, Agent, or Firm* — Harrington & Smith; Louis J. Percello

(57) ABSTRACT

A radiation dosimeter includes a semiconductor substrate and a buried insulator layer disposed on the semiconductor substrate. The buried insulator layer has a plurality of charge traps. A semiconductor layer is disposed on the buried insulator layer. The semiconductor layer has an emitter, an intrinsic base, and a collector laterally arranged with respect to one another. In response to radiation exposure by the radiation dosimeter, positive charges are trapped in the plurality of charge traps in the buried insulator layer, the amount of positive charge trapped being used to determine the amount of radiation exposure. A method for radiation dosimetry includes providing a radiation dosimeter, where the radiation dosimeter includes a lateral silicon-on-insulator bipolar junction transistor having a buried insulator layer; exposing the radiation dosimeter to ionizing radiation; determining a change in one of the collector current and current gain of the radiation dosimeter; and determining an amount of the radiation dose based on the change in one of the collector current and current gain.

13 Claims, 3 Drawing Sheets

(51) Int. Cl.
  *H01L 31/0312* (2006.01)
  *H01L 27/146* (2006.01)
  *H01L 21/02* (2006.01)
  *H01L 31/0304* (2006.01)
  *H01L 31/028* (2006.01)

(56) References Cited

U.S. PATENT DOCUMENTS

| | | | |
|---|---|---|---|
| 7,388,201 B2 | 6/2008 | Cholewa et al. | |
| 7,399,794 B2 | 7/2008 | Harmon et al. | |
| 7,407,640 B2 | 8/2008 | Barrera et al. | |
| 7,754,055 B2 | 7/2010 | Harmon et al. | |
| 7,875,854 B2 | 1/2011 | Cannon et al. | |
| 8,080,805 B2 * | 12/2011 | Gordon et al. | 250/370.09 |
| 8,212,218 B2 | 7/2012 | Cabral, Jr. et al. | |
| 2010/0193695 A1 | 8/2010 | Yeow et al. | |
| 2011/0081724 A1 | 4/2011 | Swager et al. | |
| 2011/0220805 A1 * | 9/2011 | Gordon et al. | 250/370.09 |
| 2012/0091354 A1 | 4/2012 | Gerts et al. | |

FOREIGN PATENT DOCUMENTS

| | | |
|---|---|---|
| RU | 2360327 C2 | 6/2009 |
| RU | 2364891 C1 | 8/2009 |
| RU | 2427942 C1 | 8/2011 |
| WO | 2007141503 A2 | 12/2007 |

OTHER PUBLICATIONS

Gouker et al., "Effects of Ionizing Radiation on Digital Single Event Transients in a 180-nm Fully Depleted SOI Process", IEEE Transactions on Nuclear Science, vol. 56, No. 6, Dec. 2009, pp. 3477-3482.

Yau et al., "FDSOI Radiation Dosimeters", IBM T.J. Watson Research Center, Yorktown Heights, NY.

Patil et al., "Graphene Field Effect Transistors for Detection of Ionizing Radiation", 978-1-4244-9105-6/10 IEEE 2010.

Li et al., "Probing Proton Damage in SOI CMOS Technology by Using Lateral Bipolar Action", IEEE Transactions on Nuclear Science, vol. 50, No. 6, Dec. 2003.

A. Patil et al., "Graphene Field Effect Transistor as Radiation Sensor", 2011 IEEE Nuclear Science Symposium Conference Record 978-1-4673-0120, 2011 IEEE.

Esqueda et al., Modeling the Radiation Response of Fully-Depleted SOI N-Channel MOSFETs, IEEE Transactions on Nuclear Science, vol. 56, No. 4, Aug. 2009.

Barthe, "Electronic Disometers Based on Solid State Dectors", Nuclear Instruments and Methods in Physics Research B 184, 2001 pp. 158-189.

* cited by examiner

METHOD FOR RADIATION MONITORING

CROSS-REFERENCE TO RELATED APPLICATION

This is a continuation of prior U.S. patent application Ser. No. 13/625,440, filed Sep. 24, 2012, hereby incorporated by reference in its entirety.

FIELD

This disclosure relates generally to the field of radiation monitoring and dosimetry.

BACKGROUND

At present, several types of personal radiation monitors are used for recording exposure to X-rays, γ-rays, β-radiation, and other kinds of ionizing radiation. The most commonly used are ionization detectors, Geiger counters, and thermoluminescent dosimeters (TLDs).

Ionization detectors and Geiger counters can record and display the dose rate (for example, in mrad/hr), as well as the integrated dose (for example, in rads) in real time. Alarm set points can be programmed for each of these types of monitors with respect to either dose rate or integrated dose. Both types can communicate to personal computers for data logging or firmware updates, and both may be relatively expensive.

TLDs enable radiation dose to be determined based on the emission of photons which occurs when the dosimeter is heated. TLDs are relatively inexpensive, but are generally processed (that is, read out) in specially designed "readers" after a period of exposure time, typically after being deployed or worn for a period of time between one and three months. As such, they provide information only on the integrated dose for the period of time in question, and a dose rate averaged across that same period of time. Their disadvantage, of course, is that any radiation exposure is only learned after the fact, that is, no real time readout is available.

Following the events of Sep. 11, 2001, concern about the potential detonation of radiological-dispersal or "dirty" bombs in major metropolitan areas has grown. To counter this perceived threat, many large-scale detectors have been deployed in ports to monitor shipping containers, at airports, and at other points of entry into the country. In addition, many radiation detectors have been installed on top of and inside buildings in major cities, so that radiation exposure levels may be determined at any time.

In the event of a radiological incident with a serious risk of a radiation leak, such as the detonation of a "dirty" bomb or a crisis at a nuclear reactor site, such as that caused by the earthquake and tsunami in Fukushima, Japan in March 2011, first responders will need to know an individual's exposure level quickly, so that effective triage may be established. Radiation monitors within buildings could be used to assess how a radiation plume is spreading, but the critical information needed to treat exposed patients, or to assuage the fears of those presumed to have been exposed, would be a knowledge of the radiation dose to which individual had actually been exposed.

SUMMARY

In one aspect of the present invention, a radiation dosimeter comprises a semiconductor substrate and a buried insulator layer disposed on the semiconductor substrate. The buried insulator layer comprises a plurality of charge traps. A semiconductor layer is disposed on the buried insulator layer. The semiconductor layer has an emitter, an intrinsic base, and a collector laterally arranged with respect to one another. When the radiation dosimeter is exposed to radiation, positive charge is trapped in the plurality of charge traps in the buried insulator layer, the amount of positive charge trapped being used to determine the amount of radiation exposure.

In another aspect of the present invention, a method for radiation dosimetry includes providing a radiation dosimeter, said radiation dosimeter including a lateral silicon-on-insulator (SOI) bipolar junction transistor (BJT) having a buried insulator layer; exposing the radiation dosimeter to ionizing radiation; determining a change in one of the collector current and current gain of the radiation dosimeter; and determining an amount of the radiation dose based on the change in one of the collector current and current gain.

Additional features are realized through the techniques of the present exemplary embodiment. Other embodiments are described in detail herein and are considered a part of what is claimed. For a better understanding of the features of the exemplary embodiment, the reader is directed to the description and to the drawings which follow.

BRIEF DESCRIPTION OF THE SEVERAL VIEWS OF THE DRAWINGS

Referring now to the drawings wherein like elements are numbered alike in the several figures.

DETAILED DESCRIPTION

In the present disclosure, then, a radiation dosimeter is fabricated on a lateral SOI bipolar junction transistor capable of detecting doses of various kinds of ionizing radiation. The radiation dosimeter exhibits long-term charge retention that enables long-term tracking of radiation dose. The present device is a thin-base lateral bipolar junction transistor (BJT) fabricated on a SOI wafer using a CMOS (complementary metal-oxide-semiconductor) compatible process.

A lateral SOI BJT radiation dosimeter may be relatively small and inexpensive, and may be embedded in automobiles, buildings, air filters, or portable electronic devices such as computers, cell phones, music players, PDAs or GPSs, or in other items, including, but not limited to, passports, credit cards, or driver licenses. The device may be in communication with a radiofrequency (RF) tag that may communicate a radiation dosage experienced by the lateral SOI BJT radiation dosimeter to an RF tag reader. Integrated radiation dose information may be determined from the radiation dosimeter so that treatment decisions may be made quickly in an emergency situation. The radiation dosimeter may also be implanted into the body of a patient undergoing radiation therapy, in order to determine radiation dosage to a tumor, or an amount of radiation received during medical imaging. Real-time radiation dose information may be gathered from the implanted radiation dosimeter to confirm that a proper dose of radiation is delivered to a patient. The radiation dosimeter may be used in conjunction with a relatively small battery or precharged capacitor. The radiation dosimeter may also be electrically connected with one or more inductors, and be used in conjunction with an LC circuit.

Figure 1:
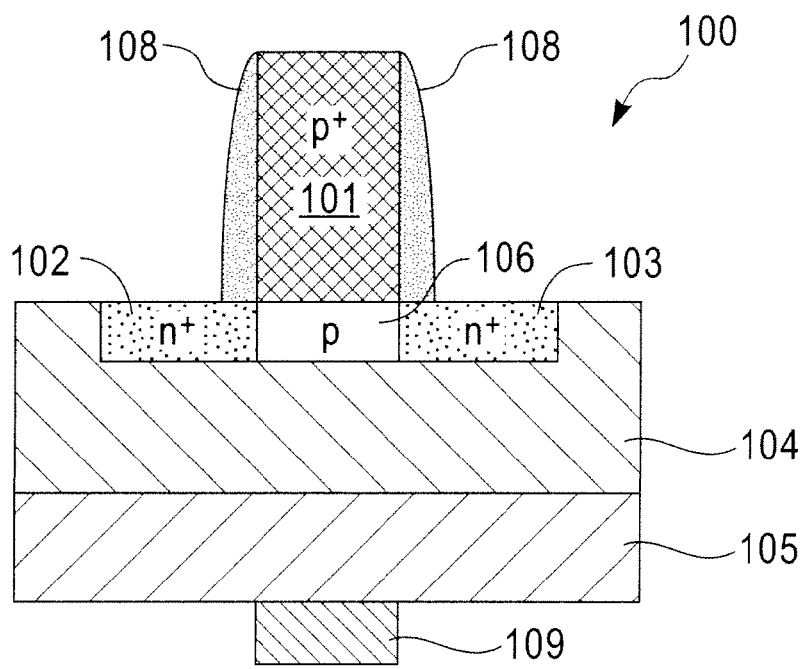
FIG. 1 illustrates a cross section of an embodiment of a lateral SOI BJT radiation dosimeter.

FIG. 1 is a cross-sectional view of an embodiment of the lateral SOI BJT radiation dosimeter 100 of the present invention. The radiation dosimeter comprises an intrinsic base 106, an emitter 102, and a collector 103, disposed in a lateral relationship with respect to one another. The radiation dosimeter also includes a buried insulator layer 104, and a semiconductor substrate 105. An extrinsic base 101 provides electrical connection to the intrinsic base 106 and functions as the base terminal of the BJT. Extrinsic base 101 is doped with an acceptor material, and intrinsic base 106 between emitter 102 and collector 103 is doped with an acceptor material to a lesser extent than extrinsic base 101. Emitter 102 and collector 103 are doped with a donor material to approximately the same extent as extrinsic base 101 is doped with an acceptor material. Optionally, a lightly doped collector region can be inserted between the intrinsic base region and heavily doped collector region. Spacer material 108 surrounds extrinsic base 101. Optionally, there is also a back contact 109 on the opposite side of the semiconductor substrate 105 from the intrinsic base 106, emitter 102, and collector 103.

Intrinsic base 106, emitter 102, and collector 103 may comprise one of silicon (Si), germanium (Ge), silicon germanium (SiGe), gallium arsenide (GaAs), indium arsenide (InAs), gallium nitride (GaN), silicon carbide (SiC), lithium fluoride (LiF), calcium fluoride (CaF$_2$), semiconducting carbon nanotubes, and grapheme with appropriate dopants. Buried insulator layer 104 may comprise silicon oxide, or silicon nitride. Alternatively, buried insulator layer 104 may comprise silicon oxide containing conductive particles serving as charge traps. For example, buried insulator layer 104 may be silicon-rich oxide, which is silicon oxide with excess silicon. The excess silicon is known to function as charge traps. Semiconductor substrate 105 may comprise one of silicon (Si), germanium (Ge), silicon germanium (SiGe), gallium arsenide (GaAs), indium arsenide (InAs), gallium nitride (GaN), silicon carbide (SiC), lithium fluoride (LiF), and calcium fluoride (CaF$_2$). Spacer material 108 may comprise silicon oxide and/or silicon nitride. Optional back contact 109 is electrically connected to semiconductor substrate 105.

The semiconductor layer (emitter 102, intrinsic base 106, and collector 103) may be 50 nm thick, and the buried insulator layer 104 may be 140 nm thick. Alternatively, the thickness of the semiconductor layer may be between about 20 and about 500 nm, and the thickness of the buried insulator layer may be between about 50 and about 500 nm. The thickness of the semiconductor substrate 105 may be less than about 800 microns.

To operate the lateral SOI BJT, current is injected from the n+-emitter 102, across the p-base barrier, intrinsic base 106, and reaches the n+-collector 103. The base/emitter junction voltage is forward biased ($V_{BE}>0$) and the base/collector junction voltage is zero or reverse biased ($V_{BC}<0$). If a positive back gate voltage ($V_X>0$) is applied to semiconductor substrate 105 at optional back contact 109, depletion will occur in intrinsic base 106 near buried oxide layer 104. The depletion lowers the barrier to current flow through intrinsic base 106, and leads to an increase in the collector current ($I_C$) at collector 103. The base current ($I_B$) also decreases because of the increase in electron concentration on the emitter region 102 near buried oxide layer 104. The net result is the increase in collector current (and current gain ($I_C/I_B$)) in the lateral SOI BJT.

Figure 2:
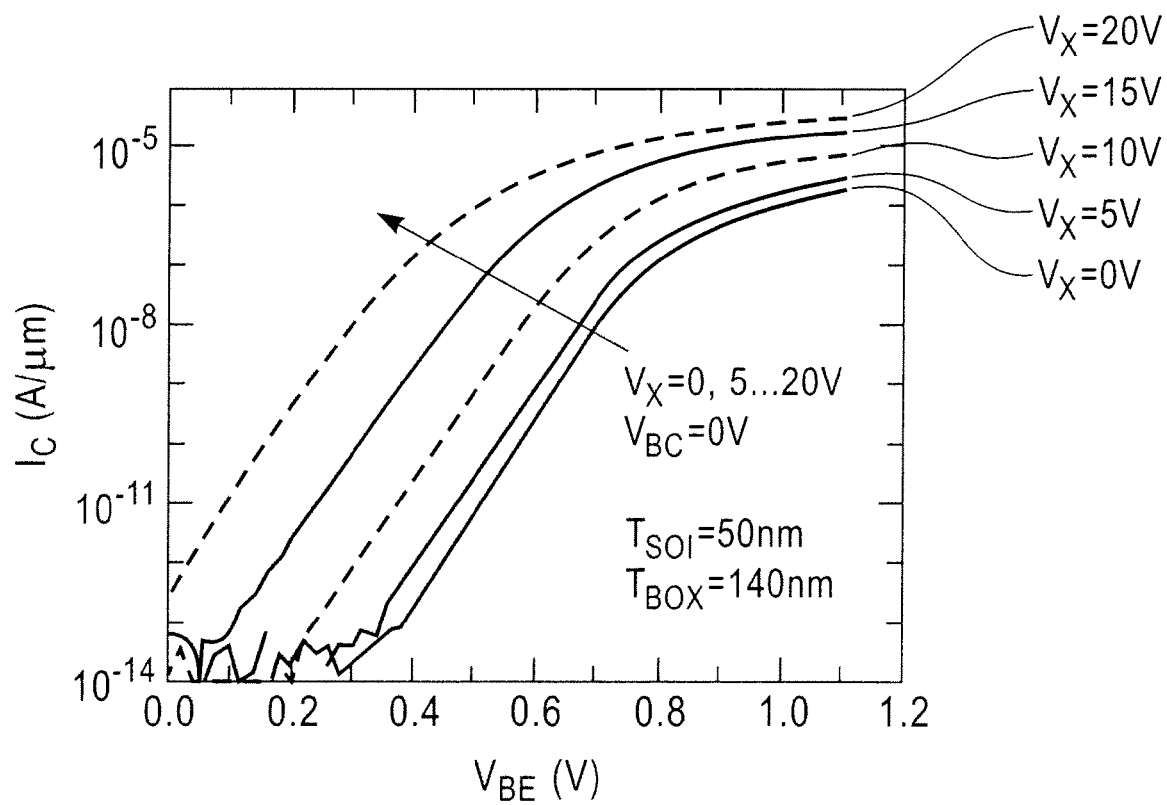
FIG. 2 is a plot of collector current against base/emitter junction voltage for several values of a back gate voltage.
Figure 3:
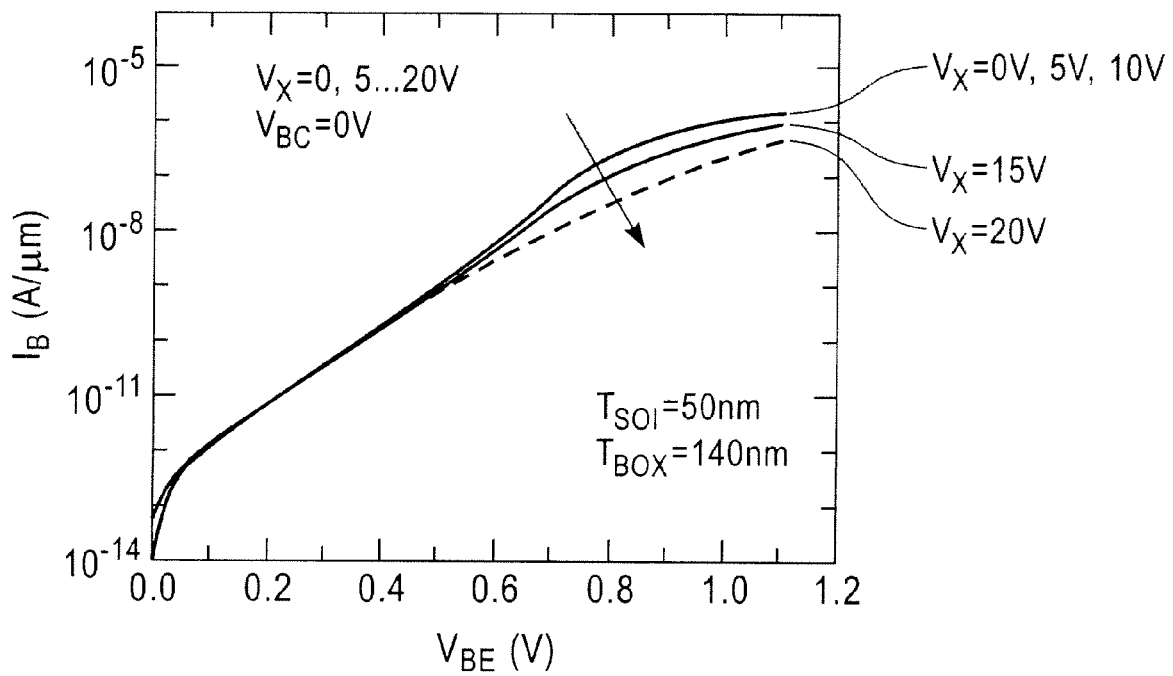
FIG. 3 is a plot of base current against base/emitter junction voltage for several values of a back gate voltage.

This result is illustrated in FIGS. 2 and 3, which are simulated data plots of collector current ($I_C$) against base/emitter junction voltage ($V_{BE}$), and base current ($I_B$) against base/emitter junction voltage ($V_{BE}$), respectively, for several positive values of the back gate voltage ($V_X$). Both FIGS. 2 and 3 show the effect of increasing the positive back gate voltage ($V_X$). In FIG. 2, the collector current ($I_C$) increases as the back gate voltage ($V_X$) increases, as indicated by the arrow in the figure. In FIG. 3, the base current ($I_B$) either does not change or decreases, as indicated by the arrow in the figure, as the back gate voltage ($V_X$) increases. In any event, the collector current ($I_C$) and current gain ($I_C/I_B$) both increase as the positive back gate voltage ($V_X$) increases. In FIGS. 2 and 3, $T_{SOI}$ refers to the thickness of the semiconductor layer (emitter 102, base region 106, and collector 103) and $T_{BOX}$ refers to the thickness of the buried insulator layer 104, where BOX stands for buried oxide.

Figure 4:
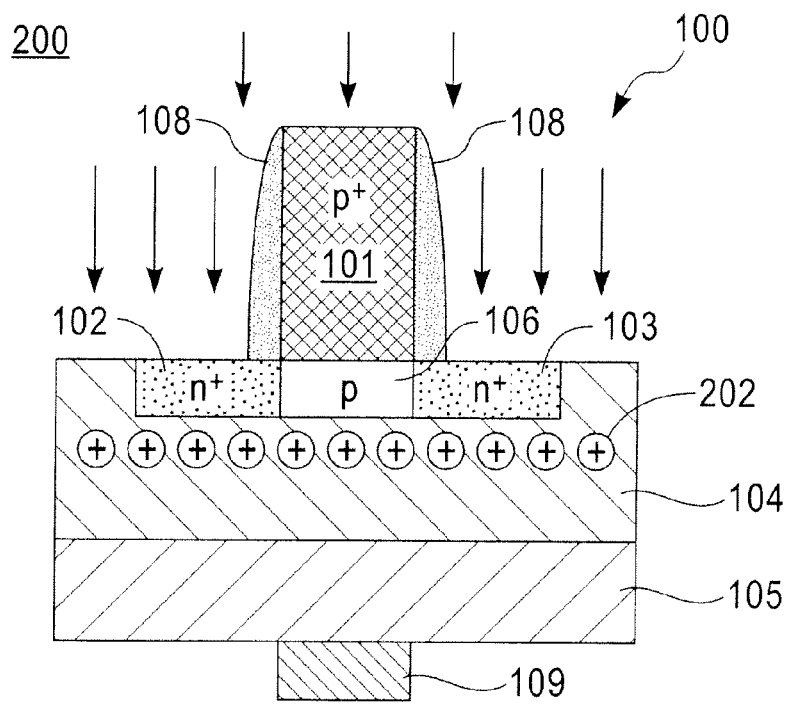
FIG. 4 illustrates a cross section of an embodiment of a lateral SOI BJT radiation dosimeter while being exposed to radiation.

Positive charges generated by ionizing radiation and trapped in the buried oxide layer 104 have an effect equivalent to that of applying a positive back gate voltage ($V_X>0$) to semiconductor substrate 105 at optional back contact 109. In this regard, FIG. 4 is a cross-sectional view of the embodiment of the lateral SOI BJT radiation dosimeter 100 shown in FIG. 1 after exposure to ionizing radiation. The radiation may include, but is not limited to, high-energy ionizing radiation, proton beam, X-ray, photons, gamma ray, or neutron beam radiation. Ionizing radiation causes electron-hole pairs to be created in buried insulator layer 104, which causes positive charges 202 to build up and be retained in buried insulator layer 104. The buried insulator layer 104 may comprise a plurality of charge traps in which positive charge 202 is trapped; the number of charge traps per cm$^3$ of buried insulator material may be between about 1E17 and 1E18. The amount of positive charge 202 is indicative of the amount of radiation to which the radiation dosimeter 100 has been exposed. In other words, the same increase in collector current ($I_C$) (and current gain $I_C/I_B$) will be observed in the lateral SOI BJT as may be observed when a positive back gate voltage ($V_X>0$) is applied to semiconductor substrate 105 at optional back contact 109 under the biasing conditions described above. When appropriately calibrated, the collector current (and current gain) may be used to record the radiation dose. Of course, a positive back gate voltage ($V_X>0$) may also be applied to semiconductor substrate 105 at optional back contact 109 to increase the trapping of positive charges (hence, larger collector current and current gain) in situations where the absorbed dose is low and difficult to detect. For this reason, the back contact 109 has been described as being optional.

For traditional applications in analog (as in amplifier circuits) and digital (as in logic circuits) applications, high bipolar collector current (and current gain) and relatively high collector currents are required. These requirements call for designs having a narrow base width. The narrow base implies that the base region be heavily doped, that is, to provide about 1E19 charge carriers per cm$^3$ for a base width of about 15 nm. In addition, a thin silicon layer (that is, emitter 102, intrinsic base 106, and collector 103) is preferred for a low base resistance.

For sensor applications, such as for radiation dosimeters, the most critical property is the shift of the bipolar turn-on voltage as a function of the charge in the insulator induced by the external environment. This sensitivity does not depend on the base width of the bipolar junction transistor, so the base width can be designed to be much wider (greater than 15 nm) to increase the sensing area. The correspondingly much lighter doped base region (less than $1.0 \times 10^{19}$ charge carriers per cm³) further enhances the sensitivity of the collector current to the charge in the insulator. This makes bipolar junction transistors for radiation dosimetry applications fundamentally different from the bipolar junction transistors used in traditional circuit applications. Furthermore, base resistance is not as important for sensor applications and a thick silicon layer is preferred to maintain a steep turn-on behavior unlike the traditional application.

Figure 5:
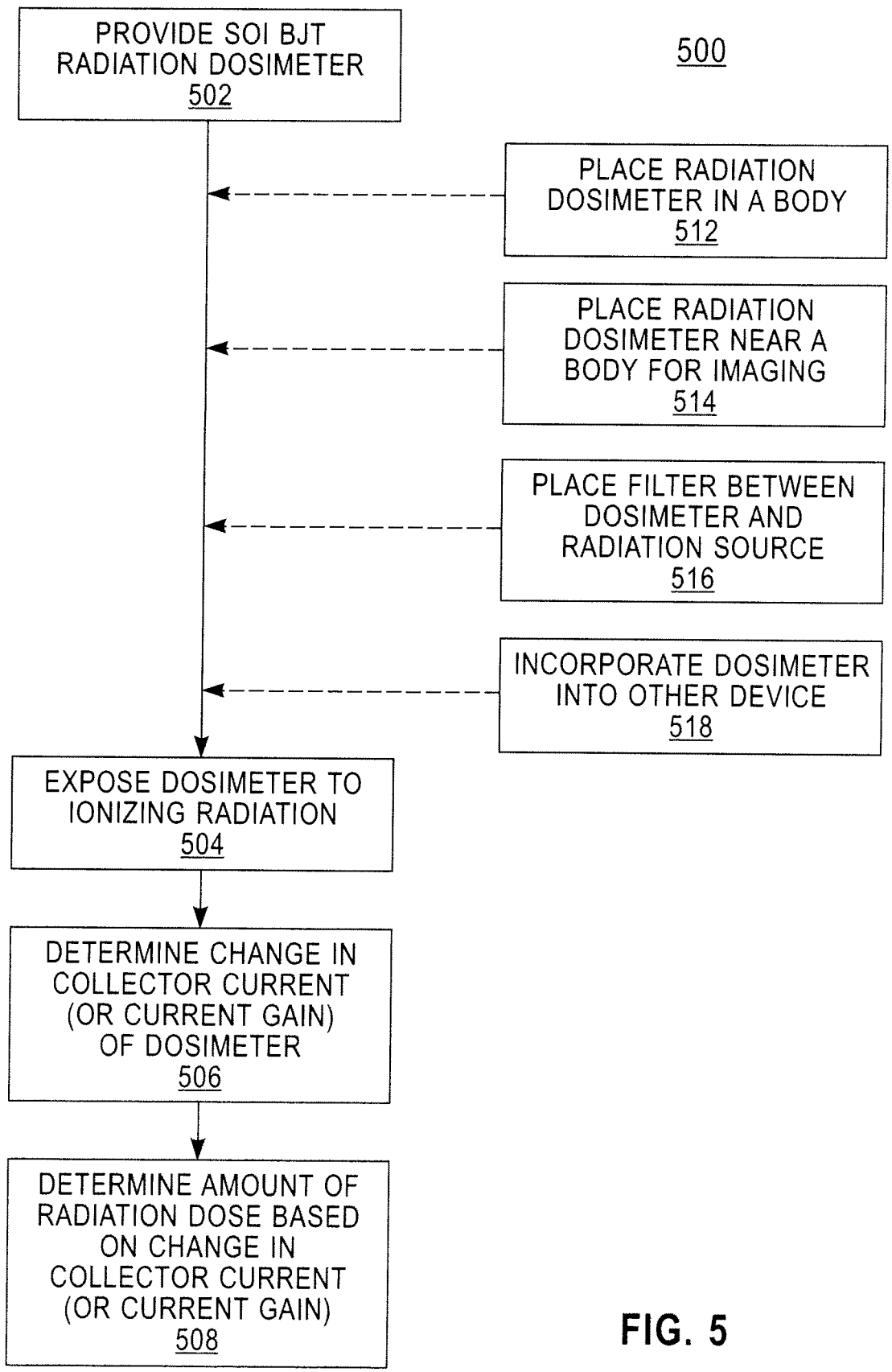
FIG. 5 illustrates a method for radiation dosimetry using a lateral SOI BJT radiation dosimeter.

FIG. 5 illustrates an embodiment of a method 500 for radiation monitoring using a lateral SOI BJT radiation dosimeter. FIG. 5 is discussed with reference to FIG. 4. In block 502, a lateral SOI BJT radiation dosimeter is provided. Several options for using the radiation dosimeter are presented in blocks 512, 514, 516, and 518. In block 512, the radiation dosimeter is placed inside a body to determine a dose of radiation received by the body. In block 514, the radiation dosimeter is placed proximate to a body to determine a dose of radiation received by the body during medical imaging. In block 516, at least one filter layer is placed between the radiation dosimeter and a source of the radiation. And, in block 518, the radiation dosimeter is incorporated into one of an automobile, a building, an air filter, a portable electronic device, such as a computer, cell phone, music player, PDA or GPS, a passport, credit card, or driver license. Other options will readily occur to those of ordinary skill in the art.

In block 504 the radiation dosimeter 100 is exposed to ionizing radiation 200, causing electron-hole pairs to be created in buried insulator layer 104. The amount of positive charge 202 is indicative of the amount of radiation to which the radiation dosimeter 100 has been exposed. In block 504, the collector current ($I_C$) and current gain ($I_C/I_B$) of the radiation dosimeter change based on the amount of radiation to which the radiation dosimeter has been exposed, due to positive charge 202 built up in buried insulator layer 104. In block 506, the increase in the collector current ($I_C$), that is, the difference between the value of the collector current ($I_C$) before and after exposure to radiation, is obtained. Alternatively, the increase in the current gain ($I_C/I_B$) may be obtained. In block 508, the amount of radiation exposure is determined based on the change in the collector current ($I_C$) or on the change in the current gain ($I_C/I_B$).

In summary, the present lateral SOI BJT radiation dosimeter has the advantage of having the $I_C$-$V_{BE}$ characteristics of an ideal 60 mV/decade. The semiconductor layer (emitter 102, intrinsic base 106, collector 103) may be thicker than 40 nm. The $V_T$ (threshold voltage) shift from buried insulator layer charge can be less sensitive to SOI thickness. Finally, the buried insulator layer 104 shows good charge retention.

A single semiconductor substrate 105 may hold a plurality of lateral SOI BJT radiation dosimeters, each SOI BJT radiation dosimeter comprising a separate extrinsic base 101, emitter 102, intrinsic base 106, collector 103, buried insulator layer 104, semiconductor substrate 105, and, optionally, back contact 109. A plurality of SOI BJT radiation dosimeters may also be arranged in an array, including, but not limited to, a linear array, a two-dimensional array, or a three-dimensional array, in order to detect radiation doses in different areas and from different directions. The different directions may be orthogonal to one another. In some embodiments, a filter may be disposed between a SOI BJT radiation dosimeter and the source of the radiation 200 to prevent some of radiation 200 from passing through the device, or to make the device more or less sensitive to the type of incident radiation. Another type of device may also be incorporated into the semiconductor substrate 105, including, but not limited to, a memory cell, a clock, a microprocessor, a DNA sensor, a biological sensor, a hazardous material sensor, a glucose sensor, a red blood cell sensor, or a camera.

The technical effects and benefits of exemplary embodiments include a relatively small, inexpensive radiation dosimeter that may be used to determine long-term or real-time radiation dosage information.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for radiation monitoring, said method comprising:
    providing a radiation dosimeter, said radiation dosimeter including a semiconductor substrate; a buried insulator layer disposed on said semiconductor substrate, said buried insulator layer comprising a plurality of charge traps; and a semiconductor layer disposed on said buried insulator layer, said semiconductor layer having an emitter, an intrinsic base, and a collector laterally arranged with respect to one another, and an extrinsic base in electrical contact with said intrinsic base;
    exposing said radiation dosimeter to ionizing radiation;
    determining a change in one of the collector current and the current gain of said radiation dosimeter; and
    determining an amount of the radiation dose based on the change in one of the collector current and the current gain.

2. The method as claimed in claim 1, further comprising the step of applying a positive back gate voltage to a substrate of said bipolar junction transistor.

3. The method as claimed in claim 1, wherein the change in one of the collector current and the current gain is determined for a preselected value of a biasing voltage of a base/emitter junction of said bipolar junction transistor.

4. The method as claimed in claim 3, wherein one of the collector current and the current gain is determined before and after the radiation dosimeter is exposed to ionizing radiation and the change in one of the collector current and the current gain is obtained by calculating the difference.

5. The method as claimed in claim 2, wherein the back gate voltage is applied to a back contact, said back contact being electrically connected to a semiconductor substrate of the bipolar junction transistor.

6. The method as claimed in claim 1, wherein one of the collector current and the current gain increases based on the amount of positive charge trapped in a buried insulator layer of the bipolar junction transistor.

7. The method as claimed in claim 1, further comprising placing said radiation dosimeter inside a body to determine a dose of radiation received by the body.

8. The method as claimed in claim 7, wherein said radiation dosimeter is placed proximate to a tumor in the body to determine a dose of radiation received by the tumor.

9. The method as claimed in claim 1, further comprising placing said radiation dosimeter proximate to a body to determine a dose of radiation received by the body during medical imaging.

10. The method as claimed in claim 1, further comprising placing at least one filter layer between the radiation dosimeter and a source of the radiation.

11. The method as claimed in claim 10, wherein said at least one filter layer prevents some of the radiation from passing through the radiation dosimeter.

12. The method as claimed in claim 10, wherein said at least one filter layer makes the radiation dosimeter more or less sensitive to some component of the radiation.

13. The method as claimed in claim 1, further comprising incorporating the radiation dosimeter into one of an automobile, a building, an air filter, a portable electronic device, such as a computer, cell phone, music player, PDA or GPS, a passport, credit card, or driver license.

* * * * *